United States Patent [19]

Thiel et al.

[11] Patent Number: 4,649,101
[45] Date of Patent: Mar. 10, 1987

[54] PROCESS FOR THE PRODUCTION OF PHOTORESIST RELIEF STRUCTURES HAVING AN OVERHANG CHARACTER USING O-QUINONE DIAZIDE PHOTORESIST WITH OVEREXPOSURE

[75] Inventors: Klaus P. Thiel, Brensbach-Wersau; Raimund Sindlinger, Ober-Ramstadt; Hans J. Merrem, Seeheim, all of Fed. Rep. of Germany

[73] Assignee: Merck Patent Gesellschaft mit beschränkter Haftung, Darmstadt, Fed. Rep. of Germany

[21] Appl. No.: 759,572

[22] Filed: Jul. 26, 1985

[30] Foreign Application Priority Data

Jul. 26, 1984 [DE] Fed. Rep. of Germany ....... 3427556

[51] Int. Cl.$^4$ .............................................. G03F 7/26
[52] U.S. Cl. .................................... 430/326; 430/296; 430/315; 430/324; 430/331
[58] Field of Search ............... 430/326, 296, 312, 314, 430/292, 156, 302, 309, 331, 315, 324

[56] References Cited

U.S. PATENT DOCUMENTS

| | | | |
|---|---|---|---|
| 3,586,504 | 6/1971 | Coates et al. | 430/331 |
| 3,849,136 | 11/1974 | Grebe | 430/314 |
| 3,867,148 | 2/1975 | O'Keeffe et al. | 430/313 |
| 4,218,532 | 8/1980 | Dunkleberger | 430/314 |
| 4,576,903 | 3/1986 | Baron et al. | 430/331 |

OTHER PUBLICATIONS

DeForest, W. S., "Photoresist Materials and Processes", McGraw-Hill Book Co., 1975, pp. 149-156.
Elliott, David J., "Integrated Circuit Fabrication Technology", McGraw-Hill Book Co., 1982, pp. 172-179.

Primary Examiner—Charles L. Bowers, Jr.
Attorney, Agent, or Firm—Millen & White

[57] ABSTRACT

A process for the production of photoresist relief structures possessing an overhang character comprising coating a substrate with a positive-working photoresist composition based on phenol/formaldehyde condensates of the novolak resin type and photosensitive o-quinonediazide compounds, imagewise overexposure of the photoresist layer at an energy exceeding that required to produce relief structures with a 90° angle between the photoresist compound and the substrate, and treatment of the overexposed layer and substrate with a buffered, aqueous, alkaline developer containing 1-100 ppm of an oxyethylated alkylphenol as a nonionic surfactant.

10 Claims, 5 Drawing Figures

PROCESS FOR THE PRODUCTION OF PHOTORESIST RELIEF STRUCTURES HAVING AN OVERHANG CHARACTER USING O-QUINONE DIAZIDE PHOTORESIST WITH OVEREXPOSURE

BACKGROUND OF THE INVENTION

The invention relates to a process for the production of photoresist relief structures having an overhang character.

Electrical and electronic components, in particular highly integrated and very highly integrated electronic circuits in modern semiconductor modules, are usually produced today with the aid of photolithographic structuring processes followed by functionalization (i.e., metal-coating) processes, in which both positive-working and negative-working photoresist materials are used. Because of the miniaturization of the circuits and functions which has been achieved, and the continuing miniaturization, such processes have to be carried out with very high precision.

Structuring and functionalization processes of this type are increasingly being carried out with the aid of the so-called "lift-off" technique, which is illustrated schematically in FIGS. 1(a)-1(d).

In FIG. 1(a) a conducting, semiconducting or insulating substrate (1) is provided with, for example, a suitable positive photoresist coating (2), and the latter is exposed imagewise through a photographic mask (3), according to the struture to be achieved. In a subsequent development step, the exposed parts of the resist layer (2) are removed, resulting in a configuration such as that shown in FIG. 1(b). Functionalization is then carried out as in FIG. 1(c) by applying a metal coating to both the surface of the photoresist relief structure and the bared substrate parts. In a further process step, the resist layer 2 together with the metal coating (4'), is lifted off from the substrate; the metal structures (4) corresponding to the photographic mask remain on the substrate as shown in FIG. 1(d).

In order to permit satisfactory removal of the metal-coated photoresist relief structure, it is of course absolutely necessary for the metal coatings on the relief structures (4') to be separate from those on the substrate (4), that is to say, not connected to one another. In the conventional coating techniques, such as vapor deposition of metals, separation of the metal coating is ensured only if the photoresist relief structures have an overhang, that is to say, their side walls are at an angle of more than 90° to the substrate surface covered by the resist. This is shown in FIGS. 1(b) and (c). Furthermore, such overhanging relief structures have an advantageous effect on the shape of the metal structures subsequently to be produced on the substrate by metal coating. Metal structures having a trapezoidal cross-section, as shown in FIG. 1(d), are particularly desired in the production of conductor paths and contacts on the substrate.

Techniques for the production of photoresist relief structures having an overhang character, photoresist and developer systems specifically tailored for this purpose, and appropriate process sequences have been disclosed, for example in European Patent Application EP-A No. 0045639. According to the prior art, such resist structures having an overhang can be produced by building up the resist coating in a plurality of layers, two or more layers of different photoresist materials having different radiation sensitivities and/or developabilities being applied one on top of the other on the substrate. However, special photoresist formulations suitable only for this purpose and/or special developers must also be used. In each case, the controlled, precise and reproducible production of the relief structures having an overhang character requires not only specially selected materials but also expensive and complicated process control.

SUMMARY OF THE INVENTION

An object of the invention is therefore to provide a process for the production of photoresist relief structures having an overhang character, which process can be carried out in a simple and uncomplicated manner and, as far as possible, does not require the use of complicated process control nor any photoresist materials and developer systems specially tailored for this purpose.

Upon further study of the specification and appended claims, further objects and advantages of this invention will become apparent to those skilled in the art.

It has been found that relief structures having an overhang character can be obtained in a remarkably simple manner if positive-working photoresist compositions coated to obtain a single photoresist layer based on phenol/formaldehyde condensates of the novolak resin type and photosensitive o-quinonediazide, compounds are overexposed. Where such a photoresist layer is overexposed, during subsequent development with an aqueous alkaline developer which contains 1-100 ppm of oxyethylated alkylphenols, relief structures having an overhang character are formed.

The present invention therefore relates to a process for the production of photoresist relief structures having an overhang character by coating of a substrate to form a single photoresist layer with a positive-working photoresist composition based on phenol/formaldehyde condensates of the novolak resin type and photosensitive o-quinonediazide compounds, imagewise exposure of the dried photoresist layer and treatment with a buffered aqueous alkaline developer containing non-ionic surfactants, wherein the photoresist coating is overexposed and then developed with a developer which contains 1-100 ppm of oxyethylated alkylphenols.

DETAILED DESCRIPTION OF THE INVENTION

Figure 1A:
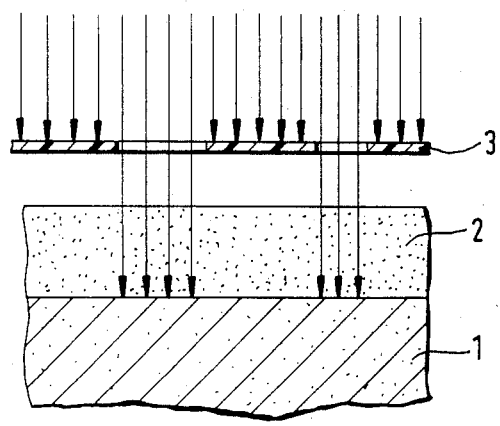

Positive-working photoresist compositions which are suitable for the process according to the invention are in principle all those which are essentially based on mixtures of phenol/formaldehyde resins and photosensitive o-quinonediazide compounds. These are, in particular, mixtures of condensation products of formaldehyde with phenols or compounds containing phenolic hydroxyl groups and naphthoquinonediazidesulphonyl derivatives. Photoresist materials of this type and their essential components have been disclosed in many prior art publications, for example German Patent Specification No. 938,233 (U.S. Pat. No. 3,106,465) and German Patent Specification No. 1,195,166 (U.S. Pat. No. 3,200,239), which disclosures are incorporated by reference herein. Appropriate materials are available commercially from a wide range of suppliers.

Particularly preferred for the intended use according to the invention are highly sensitive positive photoresist materials which permit very faithful reproduction and high resolution of the fine structures in the μm range. Appropriate materials are likewise known and commercially available, and are described in, for example, German Offenlegungsschrift DE-OS No. 3,220,816 and in German Patent Application No. P 33 44 202, equivalent to U.S. patent application Ser. No. 679,415, which disclosures are incorporated by reference herein.

Using the known materials and conventional processes, in which imagewise exposure of the resist coating is followed by a development step with an aqueous alkaline developer, it is known that it is difficult, particularly in the production of highly resolved structures in the μm range, to obtain relief structures having high contrast, that is to say with sharp corners and edges and side walls which are as vertical as possible. In general, the structures obtained have more or less rounded corners and edge and side walls exhibiting a finite slope. Unfortunately, the latter is not sufficient to provide a functional overhang as required but merely degrades resolution. These effects are not due to intentional overexposure. It is known that these effects are due not only to optical effects such as, for example, scattering and absorption effects in the resist and reflection phenomena at the resist/substrate interface as well as interference of the projection system, but in particular also to material properties of the resist and the corrosiveness of the developer, by means of which not only the exposed parts to be removed but, to a greater or lesser extent, also the unexposed parts of the resist layer are attacked. By suitable choice of the process conditions, in particular the exposure energy and the developer concentration and development time, it is possible for the skilled worker to limit these problems, if not to eliminate them.

It has recently been disclosed in German Patent Application No. P 33 46 979, equivalent to copending U.S. patent application Ser. No. 685,085, filed Dec. 21, 1984, U.S. Pat. No. 4,576,903 in which the present inventors are also named co-inventors, said disclosure being entirely incorporated by reference herein, that it is possible to obtain, with the aid of a buffered aqueous alkaline developer containing 1-100 ppm of non-ionic surfactants, preferably oxyethylated alkylphenols, positive photoresist relief structures which exhibit hitherto unobtained resolution, sharpness, and steepness of edges. Because of the specially chosen content of said surfactants in this developer, the latter is capable of protecting the unexposed parts of the resist by hydrophobization by means of this surfactant, and is capable of achieving very sharp development of the exposed parts of the resist, which are to be removed, by hydrophilization by the surfactant. Details of these suitable developers for this invention as disclosed in the mentioned applications are fully applicable here.

In principle, all non-ionic surfactants, provided they are compatible with alkali, are suitable as the surfactant additive. Non-ionic surfactants of the type of ethoxylated alkylphenols are preferred. Ethoxylation products of alkyl phenols with 6-14 carbon atoms in the alkyl chain and degrees of ethoxylation from 2 to 20 are commercially available. An ethoxylated nonylphenyl having a mean degree of ethoxylation of about 9 is particularly preferred.

Figure 1B:
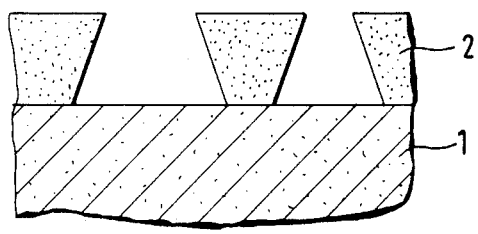
Figure 1C:
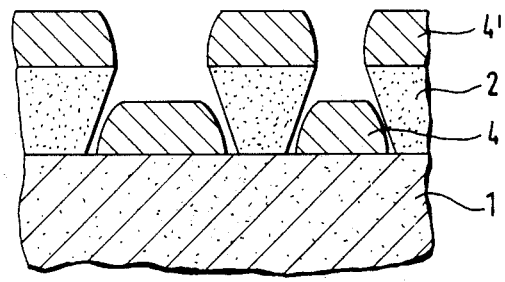
Figure 1D:
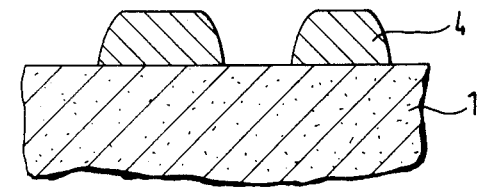

If, however, according to the instant invention, the resist layer is exposed beyond the extent required to achieve sharp 90° edges the effect of scattered and reflected radiation at the resist/substrate interface increases, and a greater amount of radiation penetrates the resist areas covered by the image-bearing mask so that these areas too achieve a certain degree of developability. After such an over-exposure according to this invention, development with such a selective developer as the one disclosed in No. P 33 46 979 thus results in the removal of a certain amount of resist material in the boundary areas of the resist which have been partially exposed to the scattered and reflected radiation. This therefore results in the formation of relief structures whose side walls form an angle of more than 90° with the substrate surface covered by the resist, as shown in FIG. 1(b).

In order to use such relief structures in the "lift-off" technique, angles of more than 90°, that is to say at least 91°, are required Angles of the side walls of the resist of 95°-120° are particularly advantageous.

The angle of the overhang and its dimensions as such can be controlled according to the invention in a simple manner by the total exposure energy. The exposure energy varies depending on the resist system, and the skilled worker can readily determine the appropriate energy values for the particular resist system by simple trials. For highly sensitive resist systems, as described in German Offenlegungsschrift No. 3,220,816 and German Patent Application No. P 33 44 202, energies of 15-25 mJ/cm$^2$ are suitable for effecting sufficient overexposure in the resist coating. Exposure energies of 18-22 mJ/cm$^2$ are preferred for these systems. Generally, for any resist, the energy is about 15-100% greater, preferably 40-70% greater, than the amount necessary to produce optimally square side walls and highest resolution. This range is limited at the upper end by the need to apply the energy at a level less than that at which resolution of the relief structure begins to degrade. This value may easily be determined by one of ordinary skill in the art with only routine preliminary tests.

The development time is not critical since the developer does not tend to produce overdevelopment, as already shown in No. P 33 46 979.

By means of the invention, it is therefore possible to obtain in a simple manner relief structures having an overhang character by using conventional, e.g., commercial positive photoresist materials and a highly selective developer. An appropriate choice of the exposure energy is made while very substantially maintaining all other process conditions otherwise conventionally employed in the production of "standard" relief structures.

Without further elaboration, it is believed that one skilled in the art can, using the preceding description, utilize the present invention to its fullest extent. The following preferred specific embodiment is, therefore, to be construed as merely illustrative, and not limitative of the remainder of the disclosure in any way whatsoever. In the following example, all temperatures are set forth uncorrected in degrees Celsius; unless otherwise indicated, all parts and percentages are by weight.

EXAMPLE

A commercial positive photoresist based on an esterification product of 5-oxo-6-diazo-5,6-dihydronaphthalenesulphonic acid with 2,3,4-dihydroxybenzophenone according to German Offenlegungsschrift No. 3,220,816 and on a cresol/formaldehyde novolak resin according to No. P 33 44 202 (Merck Selectilux ®) is applied onto the surface of thermally oxidized silicon wafers by spin-coating. The layer thickness after predrying for 30 minutes at 90° C. is 1.2 μm. Thereafter, the wafers are exposed through a mask having a line pattern at an exposure energy of 22 mJ/cm² by the contact printing technique. The exposed wafers are then developed at 20° C. for 60 seconds by the immersion method, using a developer based on sodium metasilicate and primary, secondary, and if appropriate, tertiary sodium phosphates which developer, according to No. P 33 46 979, has a content of 0.005% by weight (corresponding to 50 ppm) of an oxyethylated nonylphenol having a mean degree of oxyethylation of 9.

Figure 2:
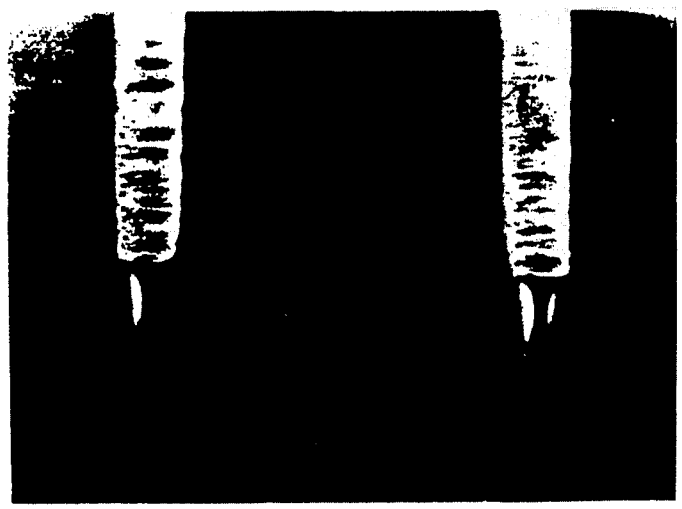

The relief structures obtained exhibit a clear overhang when examined under the scanning electron microscope; the angle between the side walls of the resist and the substrate surface covered by the resist relief structure is about 100° (FIG. 2).

The preceding example can be repeated with similar success by substituting the generically or specifically described reactants and/or operating conditions of this invention for those used in the preceding example.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process for the production of photoresist relief structures, comprising:
    (a) coating a substrate with a positive-working photoresist composition comprising an admixture of a phenol/formaldehyde condensate of the novolak type and a photosensitive o-quinoediazide compound, so as to obtain a single photoresist layer,
    (b) imagewise overexposing the single dried photoresist layer, at a sufficient exposure energy of 15-25 mJ/cm² so that the resulting side walls of the relief structure resulting after development of the exposed layer will have an overhang structure wherein the sidewalls of the relief structure form an angle of about 95°-120° with the substrate surface, and
    (c) treating the exposed photoresist layer with a buffered, aqueous alkaline developer containing 1-100 ppm of an oxyethylated alkylphenol non-ionic surfactant, whereby an image is produce in the coating on the substrate.

2. A process according to claim 1, wherein the exposure energy is about 15-25 mJ/cm².

3. A process according to claim 2, wherein the exposure energy is about 18-22 mJ/cm².

4. A process according to claim 1, wherein the positive-working photoresist composition comprises a condensation product of formaldehyde with a phenolic compound and a napthoquinonediazidesulphonyl derivative.

5. A process according to claim 1, wherein the positive working photoresist composition comprises an esterification product of 5-oxo-6-diazo-5,6-dihydronaphthalenesulfonic acid and 2,3,4-dihydroxybenzophenone and further comprises a cresol/formaldehyde novolak resin.

6. A process according to claim 1, wherein the surfactant comprises an ethoxylation product of a $C_{6-14}$ alkyl phenol.

7. A process according to claim 6, wherein the surfactant has a degree of ethoxylation of 2-20.

8. A process according to claim 7, wherein the surfactant has a mean degree of ethoxylation of about 9.

9. A process according to claim 1, wherein the side walls of the relief structure form an angle of at least 91° with the substrate surface.

10. In a method for obtaining a latent image in a substrate containing a single photoresist layer, the photoresist being a composition comprising an admixture of a phenol/formaldehyde condensate of the novolak type and a photosensitive o-quinonediazide compound, said method comprising generating the image by exposing the dried photoresist layer and subsequently developing the layer, whereby an image is produced in the coating on the substrate, the improvement comprising overexposing the single photoresist layer at a sufficient exposure energy of 15-25 mJ/cm² so that the side walls of the relief structure resulting after development of the exposed layer will have an overhang character wherein the sidewalls of the relief structure form an angle of about 95°-120° with the substrate surface, and subsequently developing the photoresist layer in a developer containing 1-100 ppm of an oxyethylated alkylphenol non-ionic surfactant.

* * * * *